United States Patent
Sakano et al.

[11] Patent Number: 5,871,659
[45] Date of Patent: Feb. 16, 1999

[54] DRY ETCHING PROCESS FOR SEMICONDUCTOR

[75] Inventors: Yoshikazu Sakano, Chita-gun; Kenji Kondo, Hoi-gun; Hajime Soga, Toyota; Yasuo Ishihara, Kariya; Yoshifumi Okabe, Anjo, all of Japan

[73] Assignee: Nippondenso Co., Ltd., Kariya, Japan

[21] Appl. No.: 665,545

[22] Filed: Jun. 18, 1996

[30] Foreign Application Priority Data

Jun. 19, 1995 [JP] Japan .................................. 7-178189

[51] Int. Cl.$^6$ ............................................. B44C 1/22
[52] U.S. Cl. ........................... 216/79; 438/719; 438/712; 438/723; 438/735
[58] Field of Search .................. 216/79; 438/719, 438/712, 723, 735

[56] References Cited

U.S. PATENT DOCUMENTS

| | | | |
|---|---|---|---|
| 4,326,911 | 4/1982 | Howard et al. | 156/643 |
| 4,726,879 | 2/1988 | Bondur et al. | 156/643 |
| 4,855,017 | 8/1989 | Douglas | 156/643 |
| 5,160,408 | 11/1992 | Long | 156/656 |
| 5,194,118 | 3/1993 | Shinohara | 156/643 |
| 5,368,684 | 11/1994 | Ishikawa et al. | 156/643 |
| 5,423,941 | 6/1995 | Komura et al. | 156/643.1 |

FOREIGN PATENT DOCUMENTS

| | | | |
|---|---|---|---|
| 2-203527 | 8/1990 | Japan | H01L 21/302 |
| 2-309633 | 12/1990 | Japan | H01L 21/302 |
| 3-109729 | 5/1991 | Japan | H01L 21/302 |
| 6-163478 | 6/1994 | Japan | H01L 21/302 |
| 6-163481 | 6/1994 | Japan | H01L 21/302 |
| 6-196451 | 7/1994 | Japan | H01L 21/302 |
| 6-232091 | 8/1994 | Japan | H01L 21/302 |

*Primary Examiner*—Nam Nguyen
*Assistant Examiner*—Steven H. VerSteeg
*Attorney, Agent, or Firm*—Pillsbury Madison & Sutro LLP

[57] ABSTRACT

A process for dry etching a silicon substrate, in which a mask exposing a region of the surface of the silicon substrate is formed, and the exposed region is dry etched. The dry etching is performed with a gas mixture including chlorine or a chlorine-containing gas, an oxygen-containing gas, and a fluorine-containing gas in which a ratio of a flow rate of oxygen gas to a flow rate of chlorine gas, $O_2/Cl_2$, is selected to be from 0.6 to 3. The gas mixture may also contain a fluorine-containing gas and helium. Preferably, the gas mixture excludes carbon-containing gases. The dry etching process allows for an increased etch rate, as well as a high etch selectivity compared to that of $SiO_2$ gas. The trench formed in the substrate by this process can be made of a larger depth with high reproducibility and good configuration. The sidewall profile angle of the trench is maintained slightly tapered, with a sidewall profile angle of approximately 90 degrees. Also, by mixing HBr gas into the gas mixture, it is possible to better control the formation of the trench. Thus, this process makes it possible to form, in a silicon substrate, a regularly configured and very deep trench with high accuracy and high etch rate.

18 Claims, 9 Drawing Sheets

DRY ETCHING PROCESS FOR SEMICONDUCTOR

CROSS REFERENCE TO RELATED APPLICATION

This application is based upon and claims the benefit of priority of the prior Japanese Patent Application No. 7-178189 filed on Jun. 19, 1995, the contents of which are incorporated herein by reference.

BACKGROUND OF THE INVENTION

1. Field of the Invention

The present invention relates to a process for forming in a silicon (Si) substrate a trench structure or deep-hole structure by dry etching. Particularly, the present invention relates to a technique which is useful when utilized in a field of manufacturing a product such as a Bi-CMOS semiconductor device having an isolation trench, a MOS capacitor device and so on that is made using Si material.

2. Related Arts

Conventionally, it is known to form a deep groove, i.e., trench, in a semiconductor device in order to perform insulation and isolation between elements. That is to say, each element formed on a silicon substrate is caused to be surrounded by a trench structure filled with a dielectric such as silicon dioxide ($SiO_2$) or polysilicon surrounded with $SiO_2$, thereby being isolated from other elements. Herein, trench etching performed is a technique for selectively etching in only the depthwise direction to thereby form a trench structure or deep-hole structure having a high aspect ratio. In order to form these structures in the manufacturing process, it is required that the etch selectivity against a silicon dioxide ($SiO_2$) film which is a masking material be high, that the etch rate be uniform, and that the anisotropy of the etch be high.

As the above-mentioned trench etching technique there is known a dry etching technique which is described in Japanese Patent Application Laid-open No. HEI-6-163478. The dry etching technique described therein uses as an etching gas a mixed gas of bromine-containing gas (hereinafter referred to as "Br system gas"), oxygen-containing gas (hereinafter referred to as "$O_2$ system gas"), silicon tetrafluoride ($SiF_4$), and sulfur hexafluoride ($SF_6$) or nitrogen trifluoride ($NF_3$).

However, in the above-mentioned dry etching technique, there is the problem that the etch rate is low although the requirements of high anisotropy and high etch selectivity against $SiO_2$ mask are satisfied.

SUMMARY OF THE INVENTION

The present invention has been made in order to solve the above-mentioned problem and an object of the present invention is to provide a dry etching process for a semiconductor which enables high etch rate while obtaining high anisotropy and high etch selectivity.

In order to attain the above-mentioned object, a dry etching process according to the present invention is to perform dry etching with respect to a silicon substrate by use of an etching gas comprising chlorine or chlorine-containing gas and an oxygen-containing gas.

Herein, it is preferable that the ratio of the flow rate of oxygen to the flow rate of chlorine, $O_2/Cl_2$, should be 0.6 to 3.

Chlorine or chlorine-containing gas (hereinafter referred to as "$Cl_2$ system gas") contributes to high-rate etching of Si whereas an oxygen-containing gas, i.e., $O_2$ system gas, contributes to enhancement of etch selectivity. Controlling the flow rate ratio thereof to a value within the above-mentioned extent can greatly improve the etch selectivity against $SiO_2$ mask and provide deep trenches, with a good reproducibility and with a good configuration, the sidewall profile angle of which is approximately 90 degrees with the sidewall being kept slightly tapered, while obtaining high etch rate with respect to Si due to the use of $Cl_2$ system gas.

A fluorine-containing gas such as $SF_6$ or $NF_3$ or a bromine-containing gas such as hydrogen bromide (HBr) may be further contained in the above-mentioned etching gas composition to control the configuration of the trench or deep-hole formed.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An explanation will now be given of concrete embodiments of the present invention.

Figure 1:
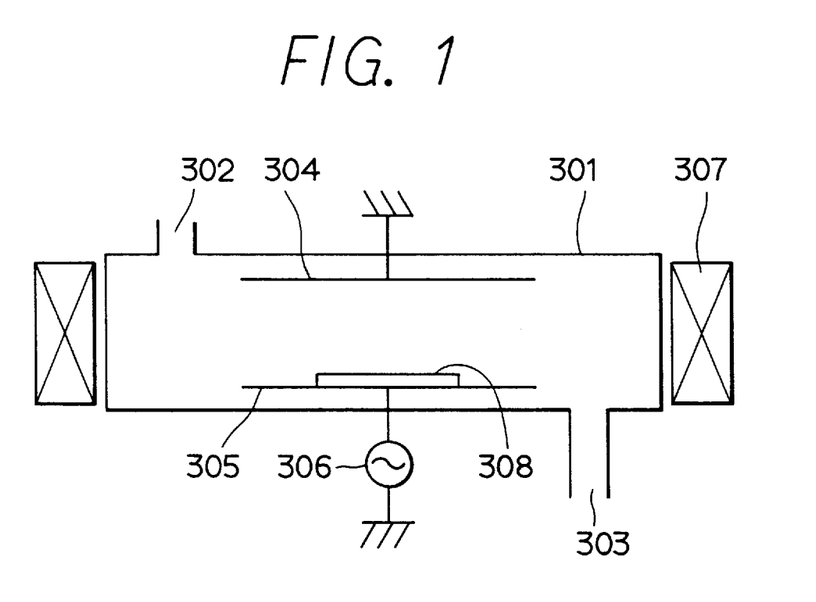
FIG. 1 is a sectional view illustrating a schematic structure of a magnetron enhanced RIE (reactive ion etching) system employed in Examples of the present invention.

As a dry etching apparatus there was used an RIE (reactive ion etching) system such as that illustrated as a schematic sectional view of FIG. 1. An ECR (electron cyclotron resonance) etching system may be used in place of the RIE system. In FIG. 1, in an etching chamber 301 there are a ground electrode (anode) 304 and an RF electrode (cathode) 305. On the RF electrode 305 is disposed a Si substrate 308 as an object to be processed, which is called cathode coupling. An etching gas that will be stated below is introduced from a gas introduction port 302 and exhausted from an exhaust port 303. Between the ground and RF electrodes 304 and 305, power having a frequency of 13.56 MHz is supplied from an RF generator 306, whereby gas plasma is produced between the electrodes, with the result that etching of the Si substrate 308 is performed. It is to be noted that this RIE system has a magnet coil 307 around the etching chamber 301 and therefore is of the magnetron enhanced type.

FIRST EXAMPLE

In the above-mentioned RIE system, the etching gases used as this Example No. 1 comprise $Cl_2$ gas, $SF_6$ gas, and $O_2$ gas that contain helium (He) gas (hereinafter referred to as "He-$O_2$ gas"). It is to be noted that as the etching gases in a Comparative Example there were used etching gases of HBr/$SiF_4$/He-$O_2$/$SF_6$. In any case, the mix ratio of He gas to $O_2$ gas is He:$O_2$=7:3.

Using the above system and gases of Example No. 1 and Comparative Example, etchings on the Si substrates 308 were carried out under the conditions described in Table 1. It is to be noted that the mask used for RIE is $SiO_2$. During the etching process, the against-$SiO_2$-film etch selectivity (the ratio of Si etch rate to $SiO_2$ etch rate), etch rate, sidewall profile angle (the angle illustrated in FIG. 2B) and $SiO_2$ film thickness reduction (an amount of reduction in film thickness of $SiO_2$ as measured from the start of the etching process to after cleaning the formed trench with 10 wt % HF for 30 seconds) were measured. Results obtained in Example No. 1 and Comparative Example are shown in FIG. 2A.

TABLE 1

| Example or Comparative Example | Comparative Example | Example 1 | Example 2 |
| --- | --- | --- | --- |
| Gas Composition | HBr/$SiF_4$/He-$O_2$/$SF_6$ | $Cl_2$/$SF_6$/He-$O_2$ | HBr/$SF_6$/He-$O_2$/$Cl_2$ |
| HBr Flow Rate (SCCM) | 40 | — | 30 |
| $SiF_4$ Flow Rate (SCCM) | 4 | — | — |
| He-$O_2$ Flow Rate (SCCM) | 8 | 20 | 20 |
| $SF_6$ Flow Rate (SCCM) | 2 | 0.2 | 2 |
| $Cl_2$ Flow Rate (SCCM) | — | 5 | 5 |
| RF Power (W) | 400 | 500 | 500 |
| Pressure (mTorr) | 80 | 100 | 100 |
| Magnetic Flux Density (Gauss) | 55 | 65 | 65 |

Figures 2A, 2B:
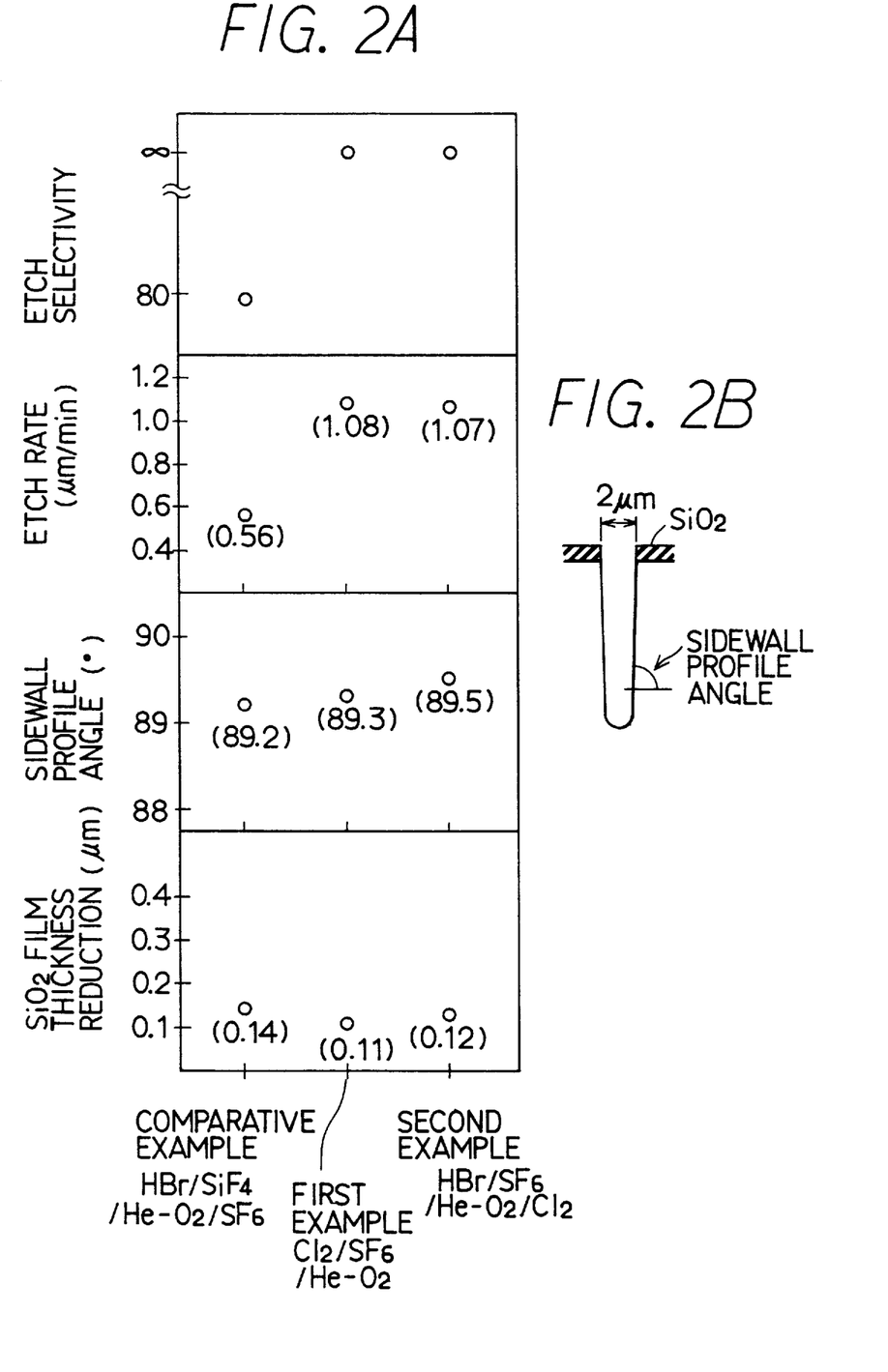
FIG. 2A is a characteristic diagram showing the measured results of the etch selectivity against $SiO_2$ film, etch rate, sidewall profile angle and $SiO_2$ film thickness reduction (an amount of reduction in thickness of the $SiO_2$ film) obtained when the etching gases in the First Example, Second Example and Comparative Example were used.
FIG. 2B is a sectional view for explaining the sidewall profile angle.
Figure 3:
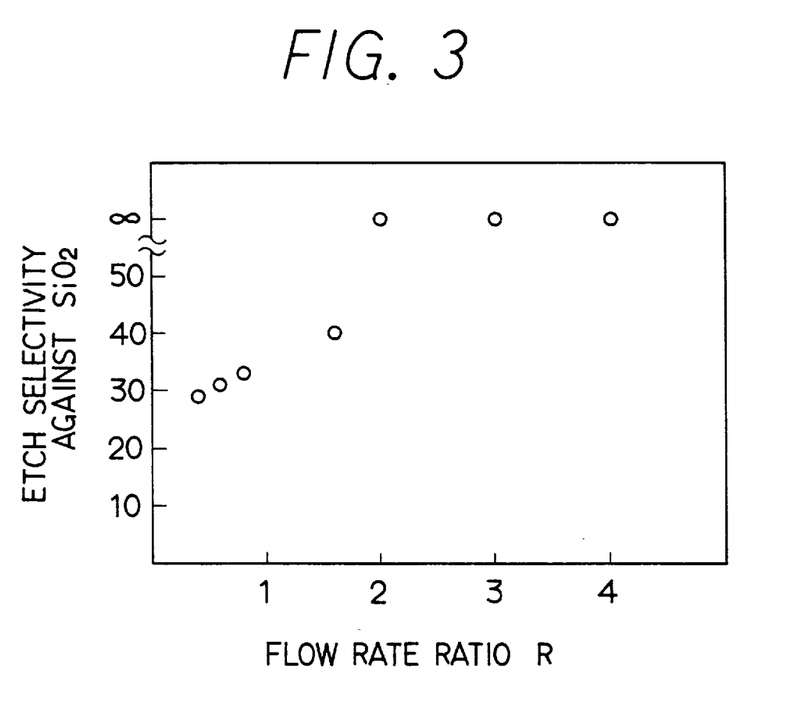
FIG. 3 is a characteristic diagram showing, by measured values, the relationship between the flow rate ratio R (ratio of the He-$O_2$ gas flow rate to the $Cl_2$ gas flow rate) and the obtained etch selectivity against $SiO_2$ film.
Figure 4:
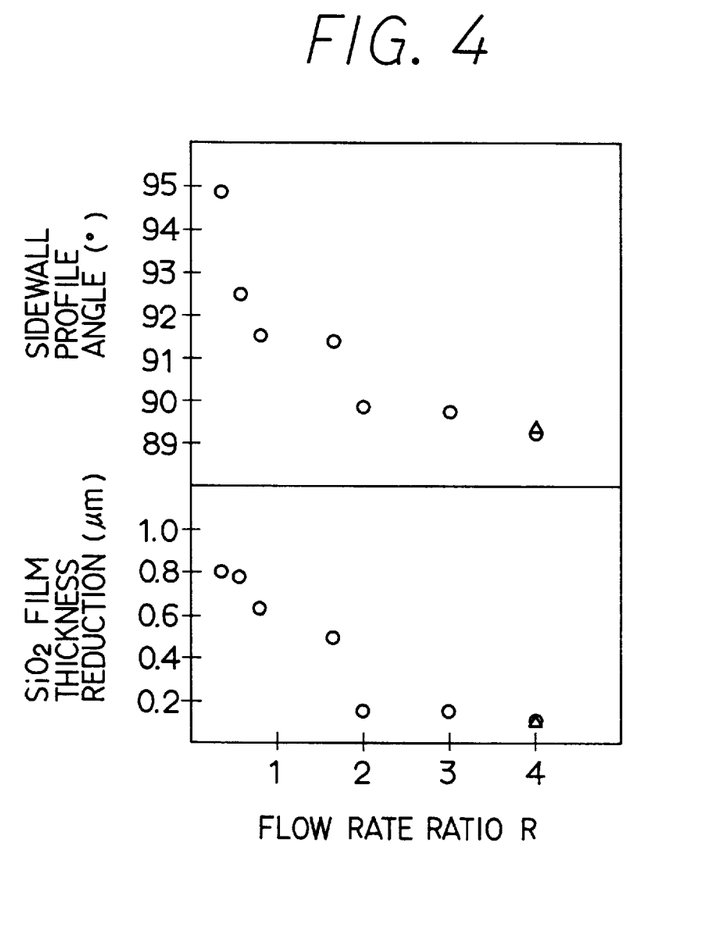
FIG. 4 is a characteristic diagram showing, by measured values, the relationship of the resultant sidewall profile angle and $SiO_2$ film thickness reduction to the flow rate ratio R.

As understood from the measured results shown in FIG. 2A, when using the etching gases of Example No. 1, the measured results of the sidewall profile angle and $SiO_2$ film thickness reduction are similar to those when using the etching gases of Comparative Example however, the measured results of the etch rate is approximately 1.1 μm/min, i.e., approximately twice as large as the value of the etch rate obtained in Comparative Example. Also, the against-$SiO_2$-film etch selectivity could also be made to be approximately infinite.

When adding a $Cl_2$ gas to the etching gas, the resulting trench is liable to be reversely tapered (sidewall profile angle of more than 90 degrees). When the trench is reversely tapered, polycrystalline Si, for example, cannot completely be embedded into the trench. For this reason, it becomes necessary to control the profile angle of the trench sidewall with a high accuracy. The reason why the trench is reversely tapered is considered to be that the etching reaction rate is too high to form the sidewall protection layer. Therefore, by adding the He-$O_2$ gas, the formation of the sidewall protection layer was made easy. As a result of this, the trench could be prevented from becoming reversely tapered.

The against-$SiO_2$-film etch selectivity, sidewall profile angle, $SiO_2$ film thickness reduction, state of formation of the sidewall protection layer and etch rate were measured while the ratio of the He-$O_2$ gas flow rate to the $Cl_2$ gas flow rate (hereinafter referred to simply as "flow rate ratio R") was being varied. The results of measurements are shown in FIGS. 3, 4, 5A and 11. From the results shown in FIG. 3, it is understood that when the flow rate ratio R is not lower than 2, the against-$SiO_2$-film etch selectivity becomes substantially infinite. Also, from the result shown in FIG. 11, although the etch rate decreases as the flow rate ratio R increases, it is understood that even when the flow rate ratio R is 4, the etch rate is approximately twice as high as that of Comparative Example, i.e., 1 μm/min. Also, observing the entire results of FIG. 11, it is estimated that the etch rate is more improved than that in Comparative Example when the flow rate ratio R is 10 or less. Regarding the sidewall profile angle, as understood from FIG. 4, the sidewall profile is prevented from becoming reversely tapered when the flow rate ratio R is not lower than 2. Regarding the $SiO_2$ film thickness reduction, as understood from FIG. 4, it is approximately the same extent as the $SiO_2$ film thickness reduction in Comparative Example (indicated in FIG. 2A) when the flow rate ratio R is not lower than 2. Accordingly, it is understood that when the flow rate ratio R becomes not lower than 2, the reaction of producing $SiO_2$ film increases due to the action of He-$O_2$ gas, with the result that etching of the $SiO_2$ mask film is prevented.

Figure 5A:
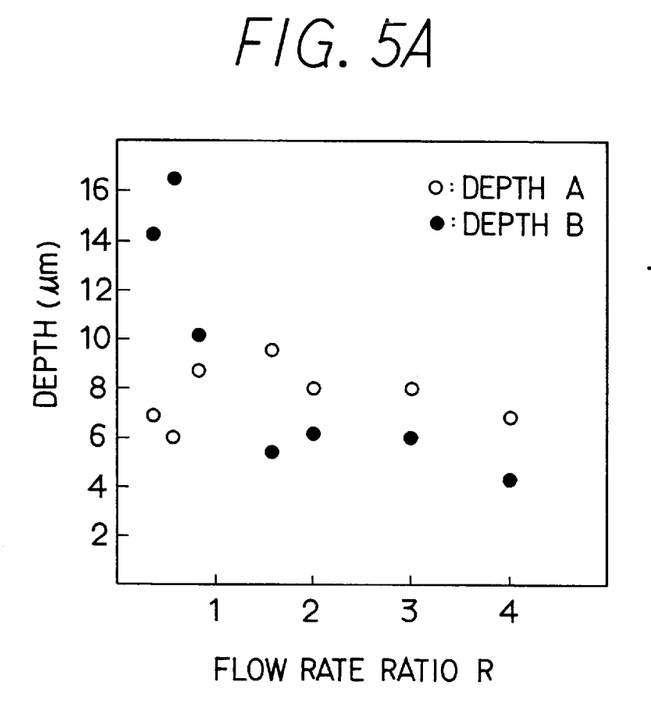
FIG. 5A is a characteristic diagram showing, by measured values relationship of the state of formation of the sidewall protection layer to the flow rate ratio R.
Figure 5B:
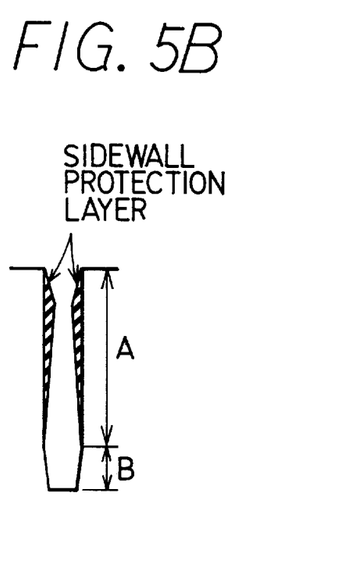
FIG. 5B is a sectional view for explaining the relationship between depth A, depth B and the sidewall protection layer formed.
Figure 6:
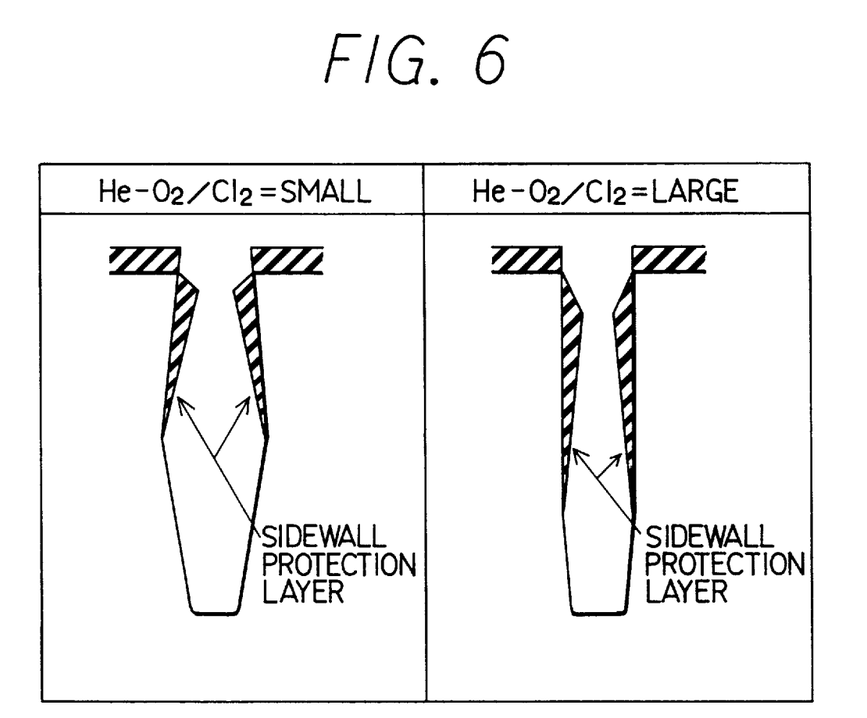
FIG. 6 is a diagram visually representing the relationship of the state of formation of the sidewall protection layer to the flow rate ratio of the He-$O_2$ gas to the $Cl_2$ gas.

Further, from the results shown in FIG. 5A, it is understood that the formation of the sidewall protection layer becomes good when the flow rate ratio R is at not lower than 2. Herein, FIG. 5B shows the relationship between depth A, depth B and the sidewall protection layer formed. As illustrated in FIG. 6, when the flow rate ratio R is lower than 2, it is understood that the sidewall protection layer is formed at an upper part of the trench, whereby the upper part of the trench near the mask becomes reversely tapered. On the other hand, as also illustrated in FIG. 6, when the flow rate ratio R becomes 2 or higher, it is understood that the sidewall protection layer is formed over an approximately entire sidewall of the trench, whereby the trench is prevented from becoming reversely tapered and etching proceeds in only a direction perpendicular to the surface of the substrate. From the above, it is understood that it is preferable that the flow rate ratio R be from 2 to 10 inclusive. More preferably, the flow rate ratio R is from 2 to 4 inclusive.

That is, from the fact that it is preferable that the flow rate ratio R between He-$O_2$ and $Cl_2$ be from 2 to 10 inclusive, it is understood from He:$O_2$=7:3 that the preferable ratio $O_2/Cl_2$ is from 0.6 to 3. Although in the present example the gas mixture wherein He:$O_2$=7:3 has been used, the invention is not limited thereto. Also, gases other than He may be used. The point is that only if the flow rate ratio between $O_2$ and $Cl_2$, i.e., $O_2/Cl_2$, is from 0.6 to 3, the resulting flow rate ratios can be included in the present invention.

Figure 7:
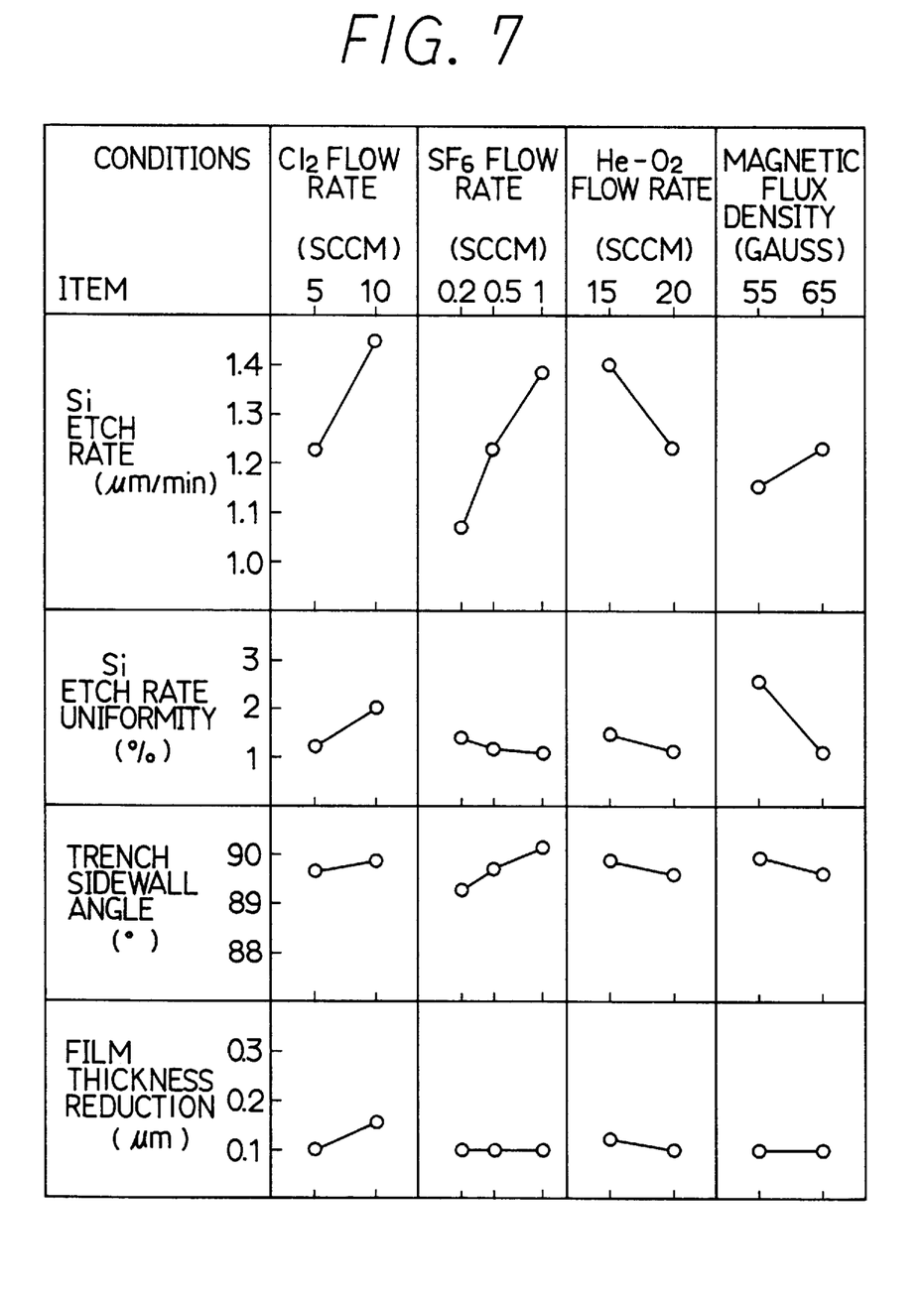
FIG. 7 is a characteristic diagram illustrating, by measured values, the relationship between, on the one hand, different rates and on magnetic flux density and the other hand, etch rate, etch rate uniformity, sidewall profile angle and $SiO_2$ film thickness reduction.

Next, the effect of $SF_6$ gas was examined. The etch rate, etch rate uniformity, sidewall profile angle of the trench and $SiO_2$ film thickness reduction were measured while the flow rate of $SF_6$ gas was varied. Also, while the $Cl_2$ gas flow rate, He-$O_2$ gas flow rate and magnetic flux density were being varied, these characteristics were similarly measured. The results obtained are shown in FIG. 7. As seen from these results, when the $SF_6$ gas flow rate increases, the etch rate increases but the tendency for the trench to become reversely tapered increases. The reason for this is that fluorine has a high tendency for causing isotropic etching. As mentioned above, even when $SF_6$ is further mixed, by the $O_2$ gas being contained in large amount as in the present invention, it is possible to suppress reverse tapering of the trench while maintaining a high etch rate. In the case of the gases in Example No. 1, it is considered that F* (fluorine radical) and $F^+$ (fluorine ion) increased due to the promoted dissociation of $SF_6$ gas, whereby the reaction with Si increased with the result that the etch rate could be increased. It is to be noted that since the sidewall protection layer formed on the sidewall of the trench has a $SiO_2$ composition, the sidewall protection layer (hatched portions in FIG. 5B) is removed simultaneously when $SiO_2$ formed on the Si substrate 308 as a protection/mask film is removed by etching, whereby it is possible to obtain a substantially vertical trench angle.

SECOND EXAMPLE

Figure 8A:
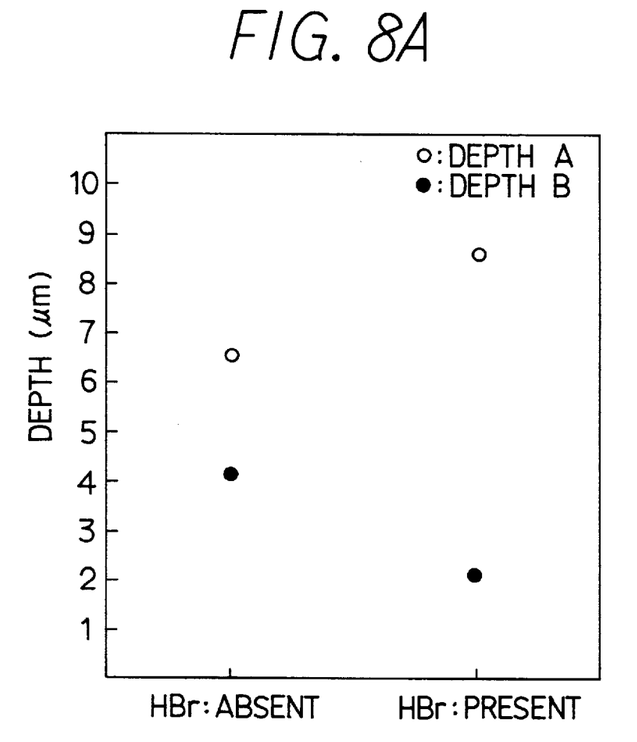
FIG. 8A is a characteristic diagram illustrating, by measured values, the states of formation of the sidewall protection layer in the absence and presence of HBr gas.
Figure 8B:
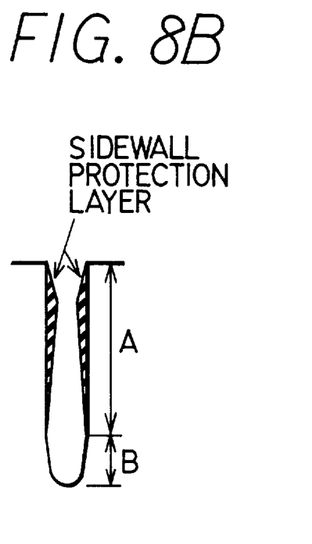
FIG. 8B is a sectional view for explaining the relationship between depth A, depth B and the sidewall protection layer formed.

In this Example No. 2, the etching gases used comprise $Cl_2$ gas, $SF_6$ gas, He-$O_2$ gas and HBr gas. The mix ratio between He and $O_2$ is He:$O_2$=7:3 as in Example No. 1. Etching was performed under the conditions described in Table 1. The against-$SiO_2$-film etch selectivity, etch rate, sidewall profile angle and $SiO_2$ film thickness reduction were also measured like in Example No. 1; the results are shown in FIG. 2A. It is understood that similar results to those in Example No. 1 are obtained. Also, the state of formation of the sidewall protection layer was measured, the results of which are shown in FIG. 8A. FIG. 8B shows the relationship between the depth A, depth B and the sidewall protection layer formed.

Figure 9:
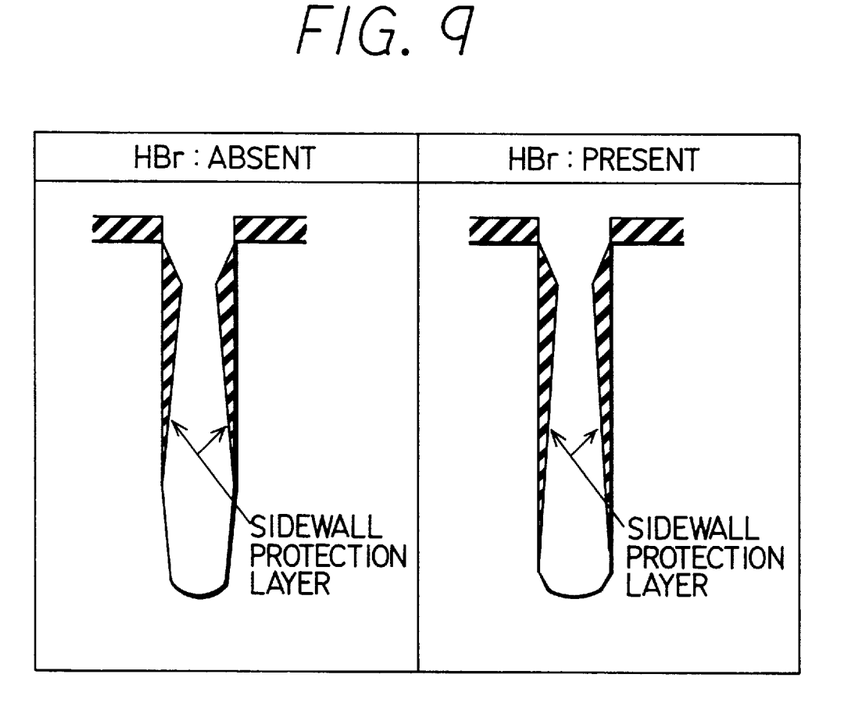
FIG. 9 is a diagram visually representing the relationship between the absence or presence of the HBr gas and the state of formation of the sidewall protection layer formed.

From FIG. 8A, it is understood that the sidewall protection layer is formed to a larger depth of the trench when the HBr gas is present, with the result that, as illustrated in FIG. 9, a more vertical trench, i.e., a trench exhibiting no reverse taper is obtained.

TABLE 2

|  | Boiling Point (°C.) |
|---|---|
| $SiF_4$ | -94.8 |
| $SiCl_4$ | 57.6 |
| $SiBr_4$ | 153 |

As understood from Table 2, in view of the vapor pressure and boiling point of $SiF_4$, $SiCl_4$ and $SiBr_4$, the degree of volatilization thereof increases in the order mentioned. From this, it is considered that the HBr gas contributes to formation of the sidewall protection layer of $Si_xBr_yO_z$ or the like.

Figure 10:
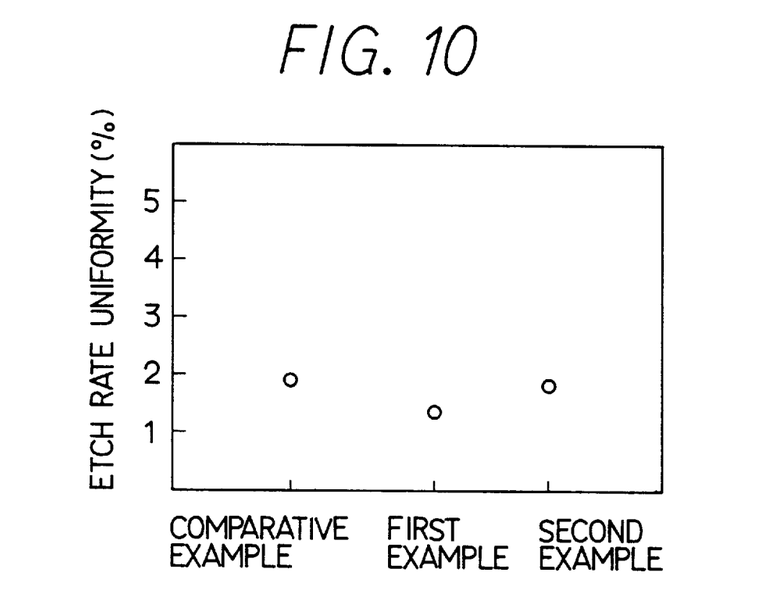
FIG. 10 is a characteristic diagram illustrating the measured etch rate uniformity.
Figure 11:
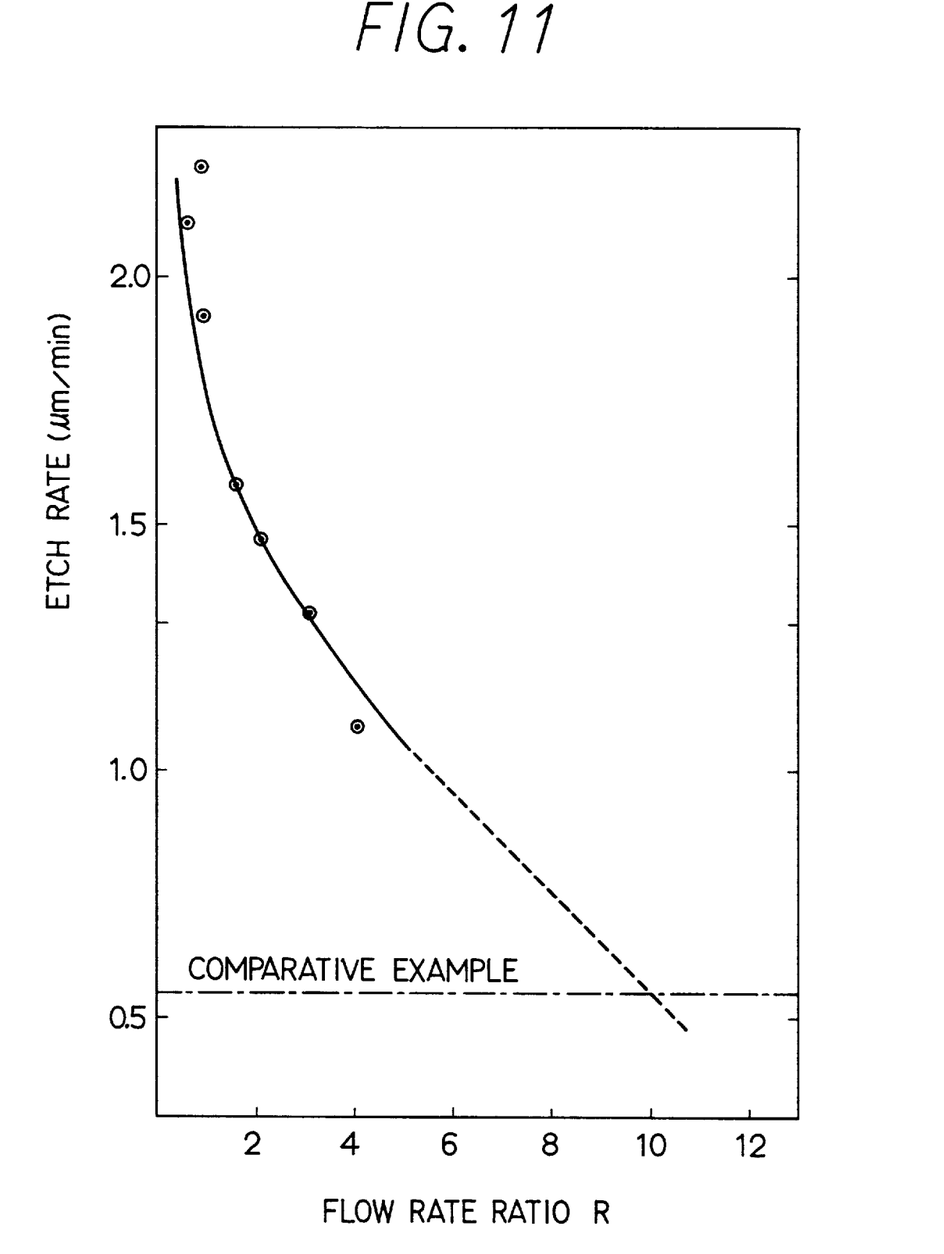
FIG. 11 is a characteristic diagram illustrating, by measured values, the relationship of the etch rate to the flow rate ratio R.

Also, using a 5-inch wafer, measurement of the uniformity of the etch rate (etch rate uniformity) was performed using measurement points inside the 10 mm outer periphery of the wafer, the results of which are shown in FIG. 10. The etch rate uniformity is within a range of 2% or less, whereby it is understood that the dry etching process of the present invention is utilizable for micro-machining of a silicon wafer.

According to the above-mentioned etching gases of the Examples, the etch rates with respect to Si are over 1 $\mu$m/min and the etch selectivities against $SiO_2$, which is a mask material, are substantially infinite. Also, the profile angles of the resultant sidewalls of the trenches could be set to be approximately 90 degrees with the sidewalls being kept slightly tapered, whereby the trenches could be formed with high reproducibility and good configuration. Also, by setting the ratio of the He-$O_2$ gas flow rate to the $Cl_2$ gas flow rate to be from 2 to 10 in each Example, the etch rate with respect to Si could be made to be higher than that in Comparative Example, the sidewalls of the trench could be made to be approximately 90 degrees and the amount of reduction in thickness of the $SiO_2$ mask film could be made to be 0.2 $\mu$m or less.

Although in each of the above Examples the $SF_6$ gas is used as a fluorine-containing gas, the invention is not limited thereto. $NF_3$ gas may be used instead of $SF_6$ gas.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A process for dry etching a silicon substrate, comprising the steps of:

forming on a surface of the silicon substrate a mask exposing a region of the surface of the silicon substrate; and dry etching the exposed region of the surface of the silicon substrate with a gas mixture comprising chlorine gas, an oxygen-containing gas, and a fluorine-containing gas, wherein a ratio of a flow rate of oxygen gas to a flow rate of chlorine gas, $O_2/Cl_2$, is selected to be from 0.6 to 3, and wherein a flow rate of said fluorine-containing gas is lower than said flow rates of said oxygen gas and said chlorine gas.

2. A dry etching process according to claim 1, wherein the fluorine-containing gas is one selected from the group consisting of $SF_6$ and $NF_3$.

3. A dry etching process according to claim 1, wherein the gas mixture further comprises a bromine-containing gas.

4. A dry etching process according to claim 3, wherein the bromine-containing gas is HBr.

5. A dry etching process according to claim 1, wherein the oxygen-containing gas in the gas mixture is a He—$O_2$ gas.

6. A dry etching process according to claim 5, wherein a mix ratio of He gas to $O_2$ gas, He:$O_2$, is 7:3, and a flow rate ratio of He—$O_2$ gas to chlorine gas is in a range of from 2 to 10.

7. A dry etching process according to claim 6, wherein said flow rate ratio of He—$O_2$ gas to chlorine gas is in a range of from 2 to 4.

8. A dry etching process according to claim 1, wherein the mask is made of silicon dioxide.

9. A dry etching process according to claim 1, wherein said dry etching step is conducted at an etch rate of at least 1 $\mu$m/min.

10. A process for dry etching a silicon substrate, comprising the steps of:

preparing a gas mixture comprising chlorine gas, an oxygen-containing gas, and a fluorine-containing gas; and dry etching a surface of the silicon substrate through a mask with said gas mixture, wherein a ratio of a flow rate of oxygen gas to a flow rate of chlorine gas, $O_2/Cl_2$, is selected to be from 0.6 to 3, and wherein a flow rate of said fluorine-containing gas is lower than said flow rates of said oxygen gas and said chlorine gas.

11. A dry etching process according to claim 10, wherein the fluorine-containing gas is one selected from the group consisting of $SF_6$ and $NF_3$.

12. A dry etching process according to claim 10, wherein the gas mixture further comprises a bromine-containing gas.

13. A dry etching process according to claim 12, wherein the bromine-containing gas is HBr.

14. A dry etching process according to claim 10, wherein the oxygen-containing gas in the gas mixture is a He—$O_2$ gas.

15. A dry etching process according to claim 14, wherein a mix ratio of He gas to $O_2$ gas, He:$O_2$, is 7:3, and a flow rate ratio of He—$O_2$ gas to chlorine gas is in a range of from 2 to 10.

16. A dry etching process according to claim 15, wherein said flow rate ratio of He—$O_2$ gas to chlorine gas is in a range of from 2 to 4.

17. A dry etching process according to claim 10, wherein the mask is made of silicon dioxide.

18. A dry etching process according to claim 10, wherein said dry etching step is conducted at an etch rate of at least 1 $\mu$m/min.

* * * * *